United States Patent [19]
Griffin

[11] 3,988,603
[45] Oct. 26, 1976

[54] MICRO-PROGRAMMING FAULT ANALYZER

[75] Inventor: Edward T. Griffin, Little Ferry, N.J.

[73] Assignee: The Bendix Corporation, Teterboro, N.J.

[22] Filed: Aug. 15, 1975

[21] Appl. No.: 605,128

[52] U.S. Cl............................ 235/153 AC; 324/73 R
[51] Int. Cl.².................................................. G06F 11/00
[58] Field of Search .. 235/153 AC, 153 A, 153 AK; 340/172.5; 324/73 R

[56] References Cited
UNITED STATES PATENTS

| | | | |
|---|---|---|---|
| 3,387,262 | 6/1968 | Ottaway et al. | 235/153 AK |
| 3,405,258 | 10/1968 | Godoy et al. | 340/172.5 |
| 3,771,131 | 11/1973 | Ling | 235/153 A |
| 3,777,129 | 12/1973 | Mehta | 235/153 AC |
| 3,927,310 | 12/1975 | D'Anna et al. | 235/153 AC |

Primary Examiner—Charles E. Atkinson
Attorney, Agent, or Firm—Anthony F. Cuoco

[57] ABSTRACT

A micro-programming fault analyzer for a high speed general purpose computer permits operator interrogation of the computer address lines whenever a selected instruction is being performed. The selected instruction is operator initiated and the fault analyzer responds to information at the computer address lines to generate the necessary functions for location of a malfunction.

4 Claims, 1 Drawing Figure

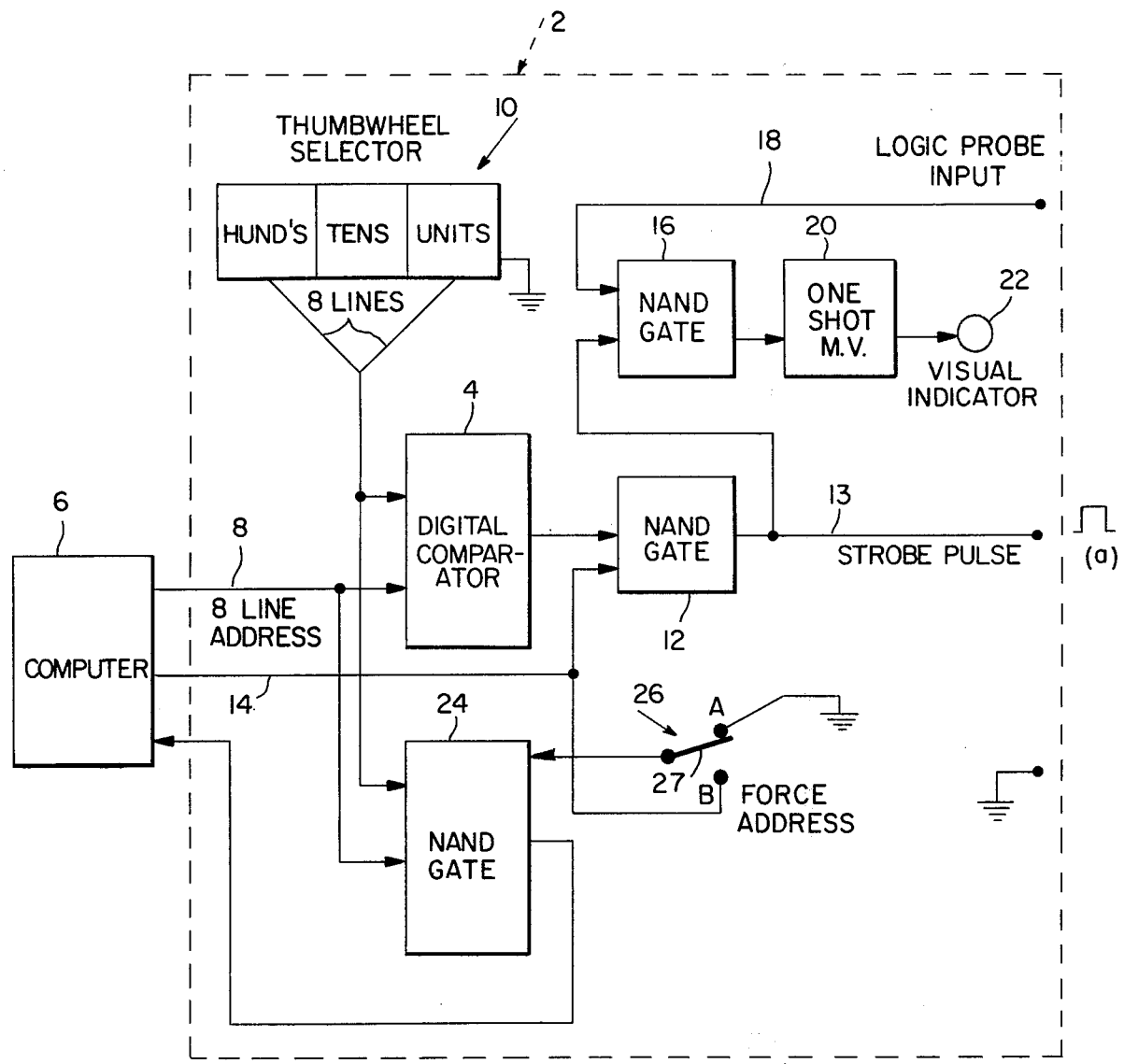

MICRO-PROGRAMMING FAULT ANALYZER

BACKGROUND OF THE INVENTION

1. Field of the Invention

This invention relates generally to high speed parallel BIT organized computers and particularly to means for analyzing operating faults in the computers. More particularly, this invention relates to means for evaluating computer operation under malfunctioning dynamic run conditions without extensive probing of hardware.

2. Description of the Prior Art

General purpose high speed computers involve parallel operation of a plurality of data BITS for proper operation. Since correct and reliable operation of the computer requires all of these BITS be at the right logic state at the right time, it is extremely difficult to determine where a fault lies when the computer malfunctions. Prior to the present invention there was no way to evaluate the computer under malfunctioning dynamic run conditions without extensive probing of hardware. Even then, using conventional test equipment, the results were relatively inconclusive as to which computer instruction was malfunctioning, much less which component was at fault. The inconclusive results were due to a lack of capability to know which instructions were being performed and at what time. In other words, there was no timing information directly related to a particular instruction which could be used to initiate a fault analysis procedure.

SUMMARY OF THE INVENTION

This invention contemplates a micro-programming fault analyzer (MPFA) which attaches to the control unit of a computer under test and interrogates the address lines of the computer in parallel. It permits an operator to request a timing or strobe pulse whenever a particular instruction is being performed, and which instruction is imposed on the MPFA by the operator. When the instruction is performed, the MPFA picks the instruction off the computer address lines and generates several functions for a logical and rapid approach in locating a malfunction. In the case of a working computer, this permits close engineering evaluation of new computer designs and modifications to existing designs. A feature of the invention is that an external input is provided which is used to probe any point within the computer. A visual indication informs the operator of the logic state of the probed point at the exact moment that the selected instruction is being performed.

Another feature of the invention permits operator intervention in the operation of the computer. If a particular instruction is malfunctioning, if it is intermittent, or if an evaluation of the instruction is desired, the operator can use the device of the invention to instruct the computer to perform only that one instruction. The computer will comply by running that instruction repeatedly, thereby allowing rapid evaluation of the instruction. This feature allows the repetitive commanding of instructions which access external interfaces or memory units which would not otherwise be accessed as often as one particular address, and thereby allows rapid isolation of dynamic problems and intermittent conditions.

One object of this invention is to provide apparatus for analyzing faults in the operation of high speed parallel BIT organized computers.

Another object of this invention is to provide apparatus of the type described which analyzes computer operation under malfunctioning dynamic run conditions without extensive probing of hardware.

Another object of this invention is to provide apparatus of the type described wherein the operator requests a timing or strobe pulse whenever a particular instruction is being performed. This pulse is then used to provide a logical and rapid location of a malfunction.

Another object of this invention is to provide apparatus of the type described which permits close engineering evaluation of new computer designs and modifications to existing designs.

Another object of this invention is to provide apparatus of the type described which provides a visual indication for informing the operator of the logic state of any point within the computer that he has probed via an external input at the exact moment that the probed instruction is being performed.

Another object of this invention is to provide apparatus of the type described which permits manual intervention in the computer operation whereby rapid isolation of dynamic problems and intermittent operating conditions can be accomplished.

The foregoing and other objects and advantages of the invention will appear more fully hereinafter from a consideration of the detailed description which follows, taken together with the accompanying drawing wherein one embodiment of the invention is illustrated by way of example. It is to be expressly understood, however, that the drawing is for illustration purposes only and is not to be construed as defining the limits of the invention.

DESCRIPTION OF THE DRAWING

The single FIGURE of the drawing is a block diagram illustrating the apparatus of the invention.

DESCRIPTION OF THE INVENTION

With reference to the drawing, the microprogramming fault analyzer (MPFA) of the invention is designated generally by the numeral 2 and is shown as including a digital comparator 4 connected to the control unit of a general purpose computer 6 through a computer output line 8 which provides an 8 line address. Computer 6 may be of the type carrying the trade designation BDX 900 as manufactured by the Navigation & Control Group of The Bendix Corporation, Teterboro, N.J.

An instruction is operator selected through a conventional type thumbwheel selector 10, and which thumbwheel selector 10 provides a signal as an 8 line address which is applied to a conventional type digital comparator 4. Digital comparator 4 compares the address at computer output line 8 with the address from selector 10.

When the compared addresses are coincident, comparator 4 applies an enabling input to a NAND gate 12. A timing signal provided by computer 6 at an output line 14 provides another enabling input to NAND gate 12 whenever any instruction is effective within the computer. Thus, the timing pulse at computer output line 14 (which indicates an effective instruction) and the output of comparator 4 (which indicates when a specific instruction is present) are combined by NAND gate 12 to provide a strobe pulse at output line 13 of NAND gate 12 as long as the selected instruction is effective within the computer, and which strobe pulse has a waveform designated as (a) in the drawing.

The strobe pulse provided by NAND gate 12 at output line 13 thereof is applied to an input of a NAND gate 16. If no other input is applied to NAND gate 16, i. e., a logic probe input at an input line 18 is not applied to NAND gate 16, NAND gate 16 will apply the strobe pulse to a one-shot multivibrator 20 which stretches the relatively fast strobe pulse to a longer pulse which may be, for purposes of illustration, 0.5 seconds in width. The stretched pulse actuates a visual indicator 22, which may be a lamp or the like, to inform the computer operator that the selected instruction is being performed. This feature of the invention is important in charting the normal or abnormal flow of the operation of computer 6 as will be understood by those skilled in the art.

A logic probe input at an input line 18 may be used to probe any point of computer 6 under test. When the logic probe input is applied to NAND gate 16, visual indicator 22 informs the operator of the logical state of the point that is being probed at the precise time that the operator selected instruction is being performed.

The address from selector 10 is applied to a NAND gate 24, as is the 8 line address at output line 8 of computer 6. Under these circumstances, if desired, the operator may switch to a forced address mode of operation by actuating a switch 26 from a normal position where a switch arm 27 is adjacent a grounded terminal A to a force address position where the switch arm is adjacent a terminal B, and which terminal B is connected to computer line 14 for receiving the computer timing signal therethrough. Thus, the normal flow of computer 6 is disabled through an output from NAND gate 24 provided in response to a forced address and an appropriate timing signal so that the computer will repeatedly perform the selected instruction as long as the forced address mode is in force. When mode switch 26 is returned to its normal position, i. e. the switch arm adjacent grounded terminal A, computer 6 will proceed to its next normal instruction in sequence.

In this connection it is to be noted that the forced mode of operation heretofore described allows evaluation of a single instruction under dynamic conditions. It further allows accessing computer memory continuously at a fixed program counter location (heretofore not possible), and finally it allows the operator to command the execution of an instruction which may not or could not proceed because external conditions, such as a fault, prevented it.

In summary, the apparatus of the invention provides a strobe (timing) pulse for as long as a selected instruction is effective within the computer. A visual indication of the selected instruction and a synchronized level detection is provided as is important in charting the normal or abnormal flow of the computer operation. A visual indication is provided for informing the operator of a computer point being probed at the precise time the selected instruction is being performed.

In the forced address mode, the normal computer flow is disabled and the selected address is forced upon it so that the computer repeatedly performs a selected instruction. The forced mode of operation allows the evaluation of a single instruction under dynamic conditions and is a desirable tool in engineering evaluation of new computer designs and modifications to existing designs.

A Micro-Programming Fault Analyzer described as aforenoted is configured, for purposes of illustration, for an 8-line address, but it will be understood by those skilled in the art that the structural concepts involved are adaptable to any width address and most computers using binary parallel arithmetic.

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. Fault analyzing apparatus for digital equipment, comprising:
    a computer providing a diigital address signal;
    operator-operative means for selecting a predetermined instruction and for providing a corresponding digital address signal;
    means connected to the computer and to the instruction selecting means for comparing the digital address signals therefrom and for providing a signal when the compared address signals are coincident;
    the computer providing a timing signal whenever the selected instruction is effective within the computer;
    gating means connected to the comparator and to the computer and responsive to the comparison signal and to the timing signal for providing a pulse when the selected instruction is effective within the computer;
    second gating means connected to the first mentioned gating means and responsive to the pulse therefrom for providing a second pulse;
    means connected to the second gating means for stretching the second pulse;
    indicating means connected to the pulse stretching means and responsive to the stretched pulse for indicating that the selected instruction is effective within the computer;
    means connected to the operator-operative selecting means and to the computer and responsive to the digital address signals and the computer timing signal for providing a disabling signal; and
    the computer connected to said last-recited means and responsive to the disabling signal therefrom for repeatedly performing the same selected instruction.

2. Apparatus as described by claim 1, including:
    means for receiving a logic probe signal from a predetermined point of the computer;
    the second gating means connected to the first mentioned gating means and to the logic probe signal receiving means and responsive to the pulse from said gating means and the logic probe signal for providing a third pulse;
    the pulse stretching means stretching the third pulse; and
    the indicating means responsive to the stretched third pulse for indicating the logic state of the probed point at the time that the operator selected instruction is being performed.

3. Apparatus as described by claim 1, wherein the means connected to the operator-operative selecting means and to the computer and responsive to the digital address signals and the computer timing signal for providing a disabling signal includes:

third gating means connected to the computer and to the operator-operated address selecting means for receiving the digital address signals therefrom;

means connected to the computer and to the third gating means and operator-operable for applying the computer timing signal to said gating means;

the third gating means being responsive to the digital address signals and the computer timing signal for providing a disabling output; and the computer connected to the third gating means and responsive to the disabling output for repeatedly performing the selected instruction.

4. Apparatus as described by claim 3, wherein the means connected to the computer and to the third gating means and operator-operable for applying the computer timing signal to said gating means includes:

switching means including a grounded first terminal, a second terminal connected to the computer and receiving the timing signal, and a switch arm connected to the other gating means and normally connected to the grounded first terminal; and the switch arm being operator-operated to the second terminal for applying the timing signal to the third gating means.

* * * * *